(12) United States Patent
Nomura et al.

(10) Patent No.: US 8,154,641 B2
(45) Date of Patent: Apr. 10, 2012

(54) SOLID-STATE IMAGE PICKUP DEVICE AND RADIATION IMAGE PICKUP DEVICE

(75) Inventors: Keiichi Nomura, Honjo (JP); Masakazu Morishita, Hiratsuka (JP); Chiori Mochizuki, Sagamihara (JP); Minoru Watanabe, Honjo (JP); Takamasa Ishii, Honjo (JP)

(73) Assignee: Canon Kabushiki Kaisha, Tokyo (JP)

(*) Notice: Subject to any disclaimer, the term of this patent is extended or adjusted under 35 U.S.C. 154(b) by 756 days.

(21) Appl. No.: 12/245,391

(22) Filed: Oct. 3, 2008

(65) Prior Publication Data
US 2009/0040310 A1  Feb. 12, 2009

Related U.S. Application Data

(62) Division of application No. 10/537,907, filed as application No. PCT/JP2004/001429 on Feb. 10, 2004, now Pat. No. 7,535,506.

(30) Foreign Application Priority Data

Feb. 14, 2003 (JP) ................. 2003-036834

(51) Int. Cl.
*H04N 3/14* (2006.01)
*H01L 27/00* (2006.01)

(52) U.S. Cl. ..................... 348/308; 250/208.1

(58) Field of Classification Search .......... 348/294, 348/302, 308; 250/208.1; 257/444
See application file for complete search history.

(56) References Cited

U.S. PATENT DOCUMENTS

| | | | |
|---|---|---|---|
| 5,136,358 A | 8/1992 | Sakai et al. | 357/53 |
| 5,498,880 A | 3/1996 | Lee et al. | 250/580 |
| 6,225,632 B1 | 5/2001 | Kinno et al. | 250/370.09 |
| 6,323,490 B1 | 11/2001 | Ikeda et al. | 250/370.09 |
| 7,205,547 B2 | 4/2007 | Ishii et al. | 250/370.09 |
| 7,205,568 B2 | 4/2007 | Watanabe et al. | 257/59 |
| 2003/0010922 A1 | 1/2003 | Yoon et al. | 250/370.09 |
| 2006/0065944 A1 | 3/2006 | Mochizuki et al. | 250/244 |
| 2006/0249763 A1 | 11/2006 | Mochizuki et al. | 257/291 |

FOREIGN PATENT DOCUMENTS

| | | |
|---|---|---|
| JP | 62-086857 | 4/1987 |
| JP | 11-97660 | 8/1989 |
| JP | 2-082555 | 3/1990 |

(Continued)

OTHER PUBLICATIONS

L.E. Antonuk et al., "Development of Thin-Film, Flat-Panel Arrays for Diagnostic and Radiotherapy Imaging", *Conference Proceedings of SPIE Medical Imaging VI*, Newport Beach, CA, USA (Feb. 23-27, 1992).

(Continued)

*Primary Examiner* — Timothy J Henn
(74) *Attorney, Agent, or Firm* — Fitzpatrick, Cella, Harper & Scinto

(57) ABSTRACT

A solid-state image pickup device according to the present invention has a plurality of photoelectric conversion elements and a plurality of switching elements. The photoelectric conversion element is formed above at least one switching element, and a shielding electrode layer is disposed between the switching elements and the photoelectric conversion elements. Further, a radiation image pickup device according to the present invention has a radiation conversion layer for directly converting radiation into electric charges, and a plurality of switching elements, and has the radiation conversion layer formed above one or more switching elements, and a shielding electrode layer disposed between the switching elements and the radiation conversion layer.

18 Claims, 13 Drawing Sheets

FOREIGN PATENT DOCUMENTS

| | | |
|---|---|---|
| JP | 11-121731 | 4/1999 |
| JP | 11-274524 | 10/1999 |
| JP | 2000-156522 | 6/2000 |
| JP | 2000-241557 | 9/2000 |
| JP | 13-108748 | 4/2001 |
| JP | 2001-071511 | 7/2001 |
| JP | 2001-320039 | 11/2001 |

OTHER PUBLICATIONS

J.W. Carlson et al., "Switched Field Magnetic Resonance Imaging", *SPIE Medical Imaging VI: Instrumentation*, (1992) vol. 1651, pp. 22-27.

SOLID-STATE IMAGE PICKUP DEVICE AND RADIATION IMAGE PICKUP DEVICE

RELATED APPLICATIONS

This application is a divisional of patent Ser. No. 10/537,907 (PCT/JP04/001429, filed Feb. 10, 2004), claims benefit of the filing date of that application under 35 U.S.C. §120, claims benefit 35 U.S.C. §119 of Japanese Patent Application No. 2003-036834, filed Feb. 14, 2003, and incorporates the entire disclosure of each of the mentioned prior applications herein by reference.

TECHNICAL FIELD

The present invention relates in general to a radiation image pickup device for detecting radiation such as X-rays (but including within this term, for purposes of this application, beams of alpha or beta particles, as well as gamma rays), the device being applied to a medical image diagnosis system, a non-destructive inspection system, an analyzer or the like. More particularly, the invention relates to a solid-state image pickup device for use in a flat panel detector (hereinafter referred to as "an FPD" for short when applicable). The FPD is obtained by combining a sensor array constituted by a sensor device using non-monocrystalline silicon, e.g., amorphous silicon (hereinafter referred to as "a-Si" for short) and TFT elements, with a phosphor for converting radiation into visible rays of light, etc.

BACKGROUND ART

In recent years, the technique for TFTs for liquid crystal display devices has progressed, and servicing for information infrastructure has been made satisfactory. Thus, at the present time, the FPD is proposed, and even in the medical image field, the FPD can have a large area and digitization of the FPD is attained.

This FPD is adapted to read out a radiation image in an instant to display the image on a display device simultaneously, and an image can be directly fetched in the form of digital information from the FPD. Thus, the FPD has the feature that handling and management is convenient in the safekeeping of data, and in the processing and transfer of data. In addition, it was verified that though the characteristics such as sensitivity depend on photographing conditions, the characteristics are equal to or superior to those in a conventional screen film photographing method or a computed radiography photographing method.

Commercialization of the FPD has been attained. On the other hand, various proposals for the FPD have been made for the purpose of aiming at further enhancing the sensitivity. For example, in a paper by L. E. Antonuk et al., in the journal *SPIE Medical Imaging VI*, February, pp. 23 to 27, 1992, there is disclosed a structure in which a sensor element is formed on a TFT element. In this example, adoption of the above-mentioned structure allows an open area ratio of the sensor element to be increased to make enhancement of sensitivity possible. In addition, it is described that since the TFT element is disposed right under the sensor element, an unnecessary parasitic capacitance is formed, and hence a grounded plane is provided.

In addition, in a proposal made in U.S. Pat. No. 5,498,880, granted to DuPont, likewise, there is shown a structure in which in order to increase an open area ratio, a sensor element is formed on a TFT element. In this example, there is adopted a structure in which an electrode connected to a source/drain electrode of the TFT covers the TFT element, and also serves as a separate electrode of the sensor element.

On the other hand, in a proposal in Japanese Patent Application Laid-Open No. 2000-156522, filed by Canon Kabushiki Kaisha, there is shown a structure in which for the purpose of aiming at increasing an open area ratio, a sensor element is formed above a TFT element. In this example, there is adopted a structure in which the sensor element is formed over the TFT element, but spaced from the latter by an interlayer film.

However, in the above-mentioned FPD having the sensor element formed on the TFT element, the separate electrode of the sensor element acts as a back gate electrode of the TFT element. Hence, a problem of generation of a leakage current of the TFT element is caused by the fluctuation in electric potential of the separate electrode. Such a problem appears in the form of degradation of quality of the image.

In a case where for example, an area having a large sensor output signal and an area having a small sensor output signal are disposed adjacent to each other, crosstalk that blurs the boundary between these areas appears. In addition, there is caused a problem that sensor saturation output is decreased, reducing the dynamic range.

SUMMARY OF THE INVENTION

The present invention has been made in the light of the foregoing problems, and it is, therefore, an object of the present invention to make it possible that even when an electric potential of a separate electrode of a sensor element disposed above a switching element fluctuates, the fluctuation in characteristics due to generation of a leakage current of the switching element is suppressed to attain enhancement of sensitivity.

In order to solve the above-mentioned problems, according to the present invention, there is provided a solid-state image pickup device including a plurality of photoelectric conversion elements and a plurality of switching elements, characterized in that the photoelectric conversion element is formed above at least one switching element, and a shielding electrode layer is disposed between the switching elements and the photoelectric conversion elements.

Further, according to the present invention, there is provided a radiation image pickup device including a radiation conversion layer for directly converting radiation into electric charges, and a plurality of switching elements, characterized in that the radiation conversion layer is formed above one or more switching elements, and a shielding electrode layer is disposed between the switching elements and the radiation conversion layer.

According to the present invention, the shielding layer is provided so as to be interposed between the switching element and the sensor portion formed above the switching element, whereby even when an electric potential of a separate electrode of the sensor element disposed above the switching element fluctuates, the fluctuation in characteristics due to generation of a leakage current of the switching element can be suppressed to attain enhancement of sensitivity.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

BEST MODE FOR CARRYING OUT THE INVENTION

Next, embodiments of the present invention will hereinafter be described with reference to the accompanying drawings.

Embodiment 1

Description will hereinafter be given with respect to a solid-state image pickup device using a MIS type photodiode (hereinafter referred to as "a PD" for short when applicable) according to Embodiment 1 of the present invention.

Figure 1:
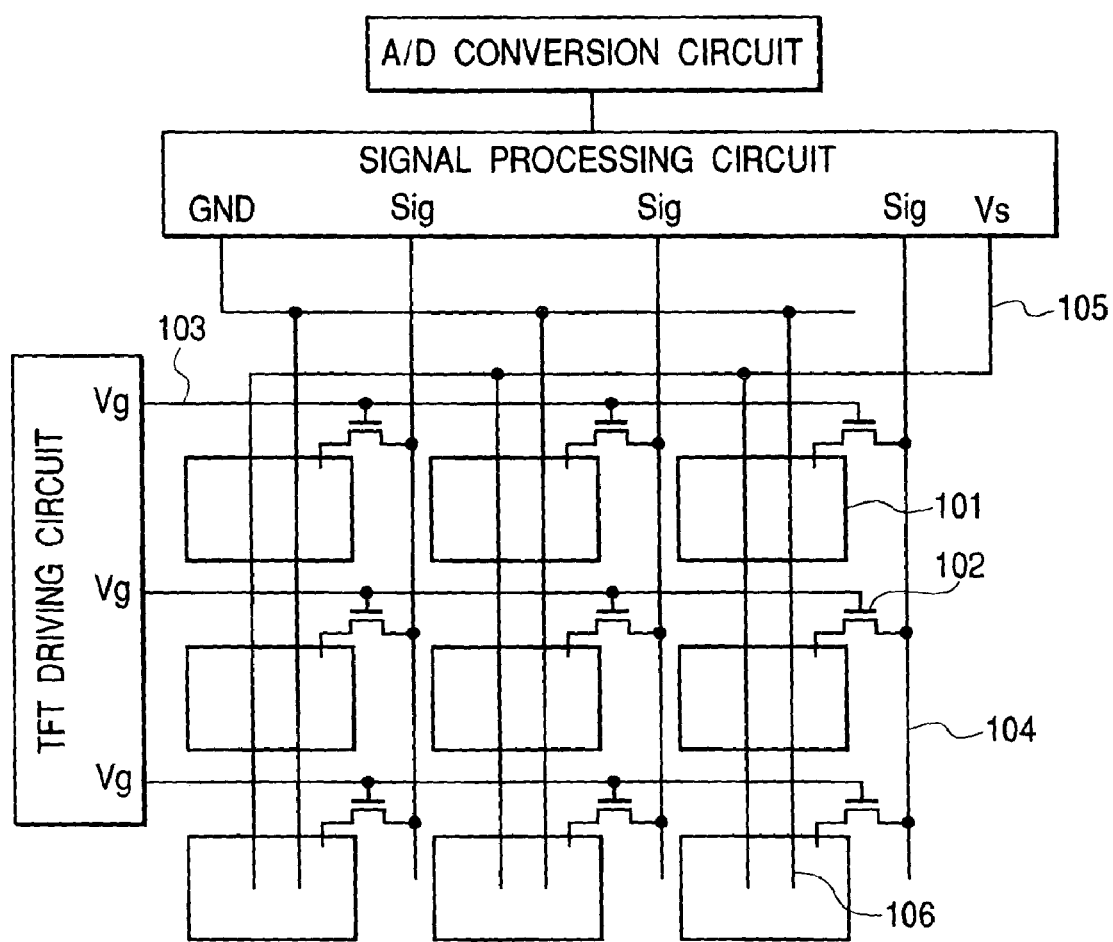
FIG. 1 is a schematic equivalent circuit diagram of pixels disposed in matrix of 3×3 of a solid-state image pickup device according to Embodiment 1 of the present invention.
Figure 2:
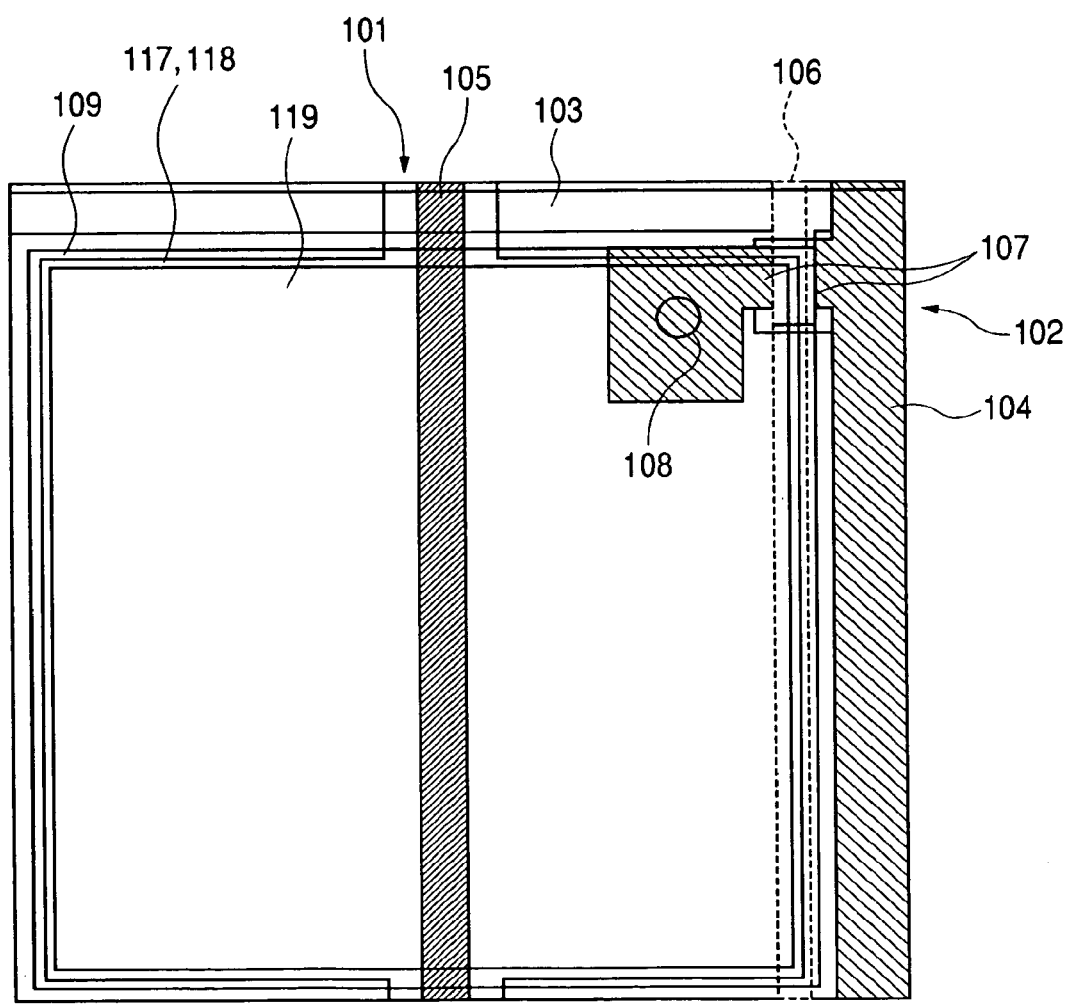
FIG. 2 is a schematic plan view of one pixel of the solid-state image pickup device according to Embodiment 1 of the present invention.
Figure 3:
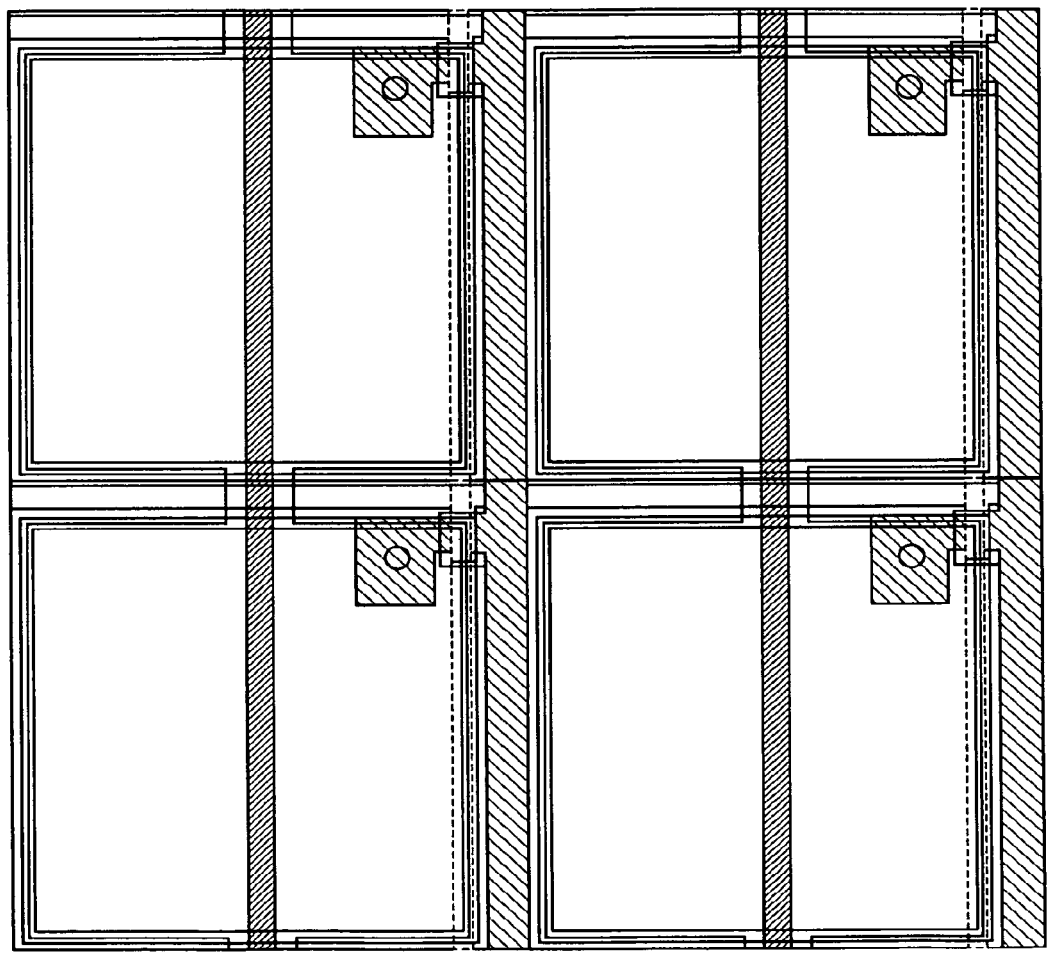
FIG. 3 is a schematic plan view of four pixels of the solid-state image pickup device according to Embodiment 1 of the present invention.
Figure 4:
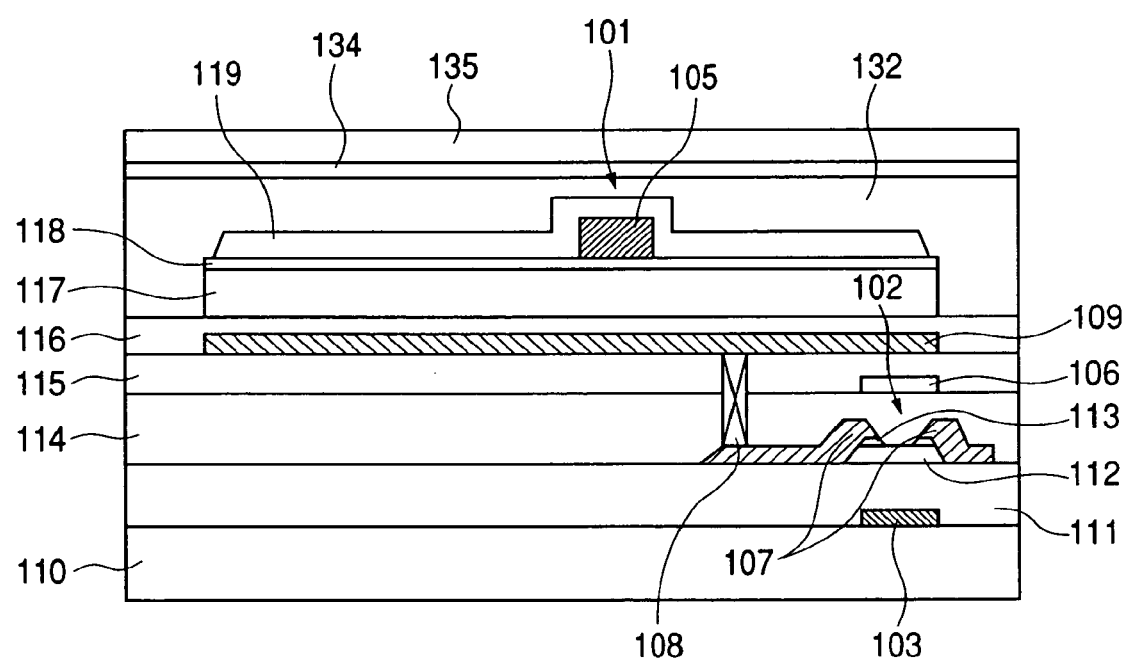
FIG. 4 is a schematic cross-sectional view of the solid-state image pickup device according to Embodiment 1 of the present invention.

FIG. 1 is a schematic equivalent circuit diagram of pixels disposed in matrix of 3×3 of a solid-state image pickup device according to Embodiment 1, FIG. 2 is a schematic plan view of one pixel of the solid-state image pickup device according to this embodiment, FIG. 3 is a schematic plan view of four pixels of the solid-state image pickup device according to this embodiment, and FIG. 4 is a schematic cross sectional view of the solid-state image pickup device according to this embodiment.

In FIGS. 1 and 2, reference numeral 101 designates a MIS type PD as a photoelectric conversion element (sensor element); reference numeral 102 designates a transferring TFT as a switching element (thin film transistor); reference numeral 103 designates a transferring TFT driving wiring; reference numeral 104 designates a signal line; reference numeral 105 designates a sensor biasing wiring; reference numeral 106 designates a shielding wiring (GND wiring); reference numeral 107, a source/drain electrode layer of the transferring TFT 102; reference numeral 108, a contact hole; and 109, a sensor lower electrode layer.

In FIG. 4, reference numeral 110 designates an insulating substrate made of glass or the like; reference numeral 111 designates a gate insulating film made of SiN, $SiO_2$ or the like; reference numeral 112 designates a first amorphous semiconductor layer made of a-Si or the like; reference numeral 113 designates a first $n^+$ type layer (ohmic contact layer); reference numerals 114 and 115 each designate an interlayer insulating film made of SiN, $SiO_2$, benzocyclobutene (BCB), polyimide (PI) or the like; reference numeral 116 designates an insulating film made of SiN, $SiO_2$ or the like; reference numeral 117, a second amorphous semiconductor layer made of a-Si or the like; reference numeral 118, a second $n^+$-type layer (hole blocking layer) made of microcrystalline silicon, a-Si or the like; reference numeral 119, a transparent electrode layer made of ITO, $SnO_2$ or the like; reference numeral 132, a passivation layer made of SiN, PI or the like; reference numeral 134, an adhesion layer; and 135, a phosphor layer acting as a wavelength conversion layer.

Note that, in FIG. 4, reference numerals 103, 105 and 106 designate a gate electrode layer, a sensor biasing electrode layer, and a shielding electrode layer, respectively.

The insulating film 116, the second amorphous semiconductor layer 117 made of a-Si or the like, and the second $n^+$-type layer 118 constitute a photoelectric conversion layer of the MIS type PD 101. The gate electrode layer 103, the gate insulating film 111 made of SiN, $SiO_2$ or the like, the first amorphous semiconductor layer 112 made of a-Si or the like, the first $n^+$-type layer (ohmic contact layer) 113, and the source/drain electrode layer 107 for the transferring TFT constitute the transferring TFT 102. The photoelectric conversion layer is formed above the transferring TFT 102, and hence the transferring TFT 102 is covered with the photoelectric conversion layer.

The shielding electrode layer 106 is disposed so as to be interposed between the MIS type PD 101 and the transferring TFT 102.

Radiation such as X-rays is made incident from above in FIG. 2, to be converted into visible rays of light through the phosphor layer 135. The resultant rays are then converted into electric charges by the MIS type PD 101 to be accumulated in the MIS-type PD 101. Thereafter, the transferring TFT 102 is operated by a TFT driving circuit through the transferring TFT driving wiring 103 to transfer these accumulated electric charges to the signal line 104 connected to one of the source electrode and the drain electrode of the transferring TFT 102 to be processed in the signal processing circuit, and the resultant analog signal is then subjected to A/D conversion in the A/D conversion circuit, to be outputted. In this processing the electric potential of the shielding wiring 106 is fixed to a constant electric potential such as GND at all times.

In this embodiment, the shielding wiring 106 disposed below the sensor element is grounded. As a result, even if the electric potential of a separate electrode of the sensor element fluctuates, fluctuation in characteristics due to generation of a leakage current of the TFT element can be suppressed, to allow enhancement of sensitivity to be attained. In addition, since the shielding wiring 106 does not overlap the signal line 104 at all, no parasitic capacitance is formed between the shielding wiring 106 and the signal line 104, and hence degradation of the sensor sensitivity can also be suppressed.

In this embodiment, there has been shown the specific case where the width of the shielding wiring 106 is identical to the channel length of the TFT. However, in order to reduce a capacitance in a cross portion between the transferring TFT driving wiring 103 and the shielding wiring 106, it is also possible to use a wiring having a width smaller than the channel length in the cross portion between the transferring TFT driving wiring 103 and the shielding wiring 106.

In addition, the shielding wiring 106 has only to be held at a constant electric potential, and hence it is also possible to set the electric potential of the shielding wiring 106 to any constant electric potential other than GND. Since the resistance of the shielding wiring 106 may be high, a wiring made of a high melting point metal such as molybdenum (Mo), chromium (Cr), titanium (Ti), tungsten (W), or molybdenum-tungsten (MoW) can be used as the shielding wiring 106. This makes it possible to reduce limitations on the manufacturing process to be used. Moreover, of the layer including the gate electrode, the layer including the source/drain electrode, the layer including the shielding electrode, and the layer including the sensor biasing electrode, the shielding electrode layer is formed as the thinnest wiring in order to reduce a difference in level and to reduce a difference in level of the sensor portion formed above the shielding wiring 106, resulting in improving the yield. This is because the electrical resistance value of the shielding electrode layer may be larger than that of each of other electrode layers.

Embodiment 2

Description will hereinafter be given with respect to a solid-state image pickup device using a MIS-type PD according to Embodiment 2 of the present invention.

Figure 5:
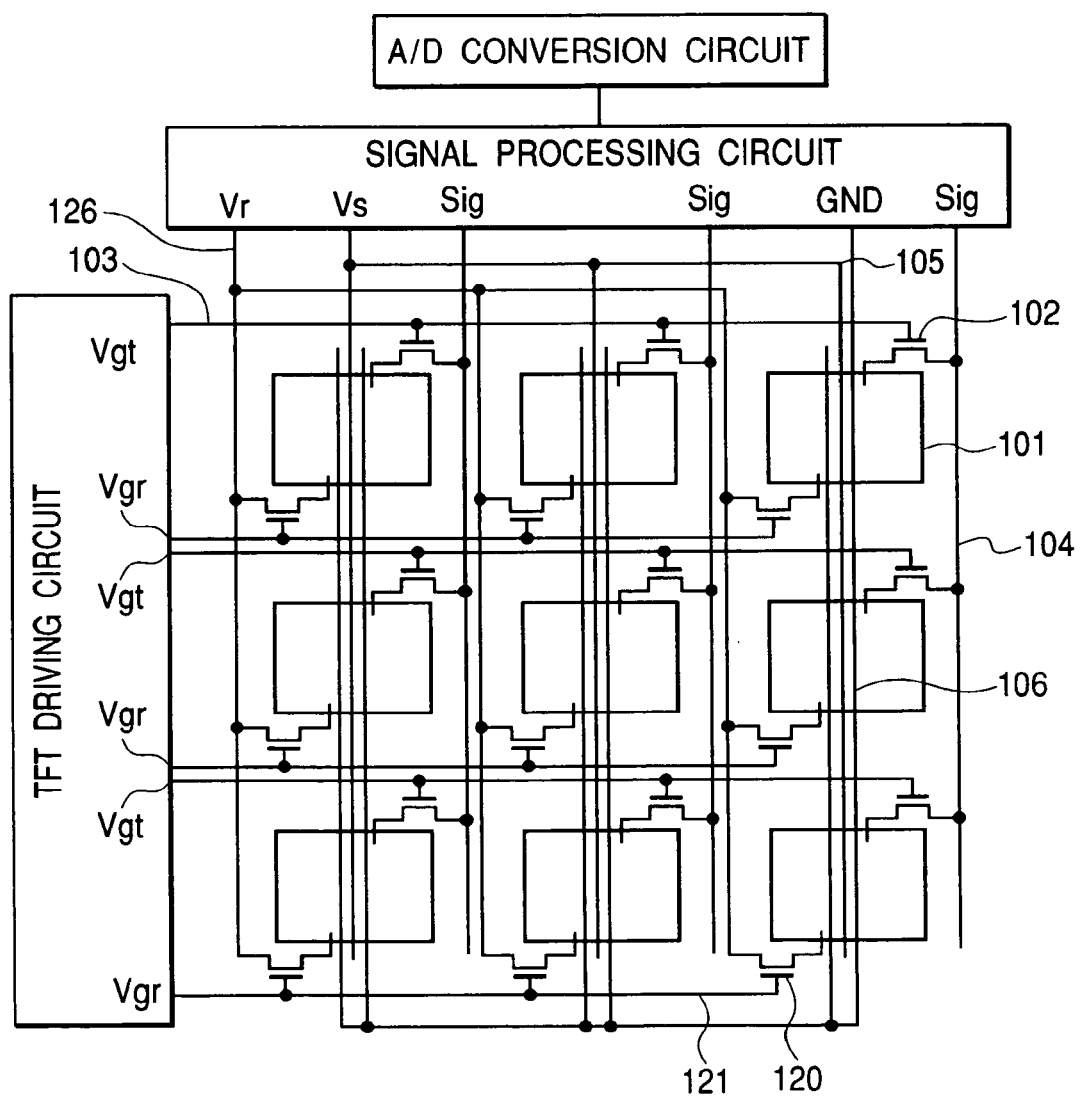
FIG. 5 is a schematic equivalent circuit diagram of pixels disposed in matrix of 3×3 of a solid-state image pickup device according to Embodiment 2 of the present invention.
Figure 6:
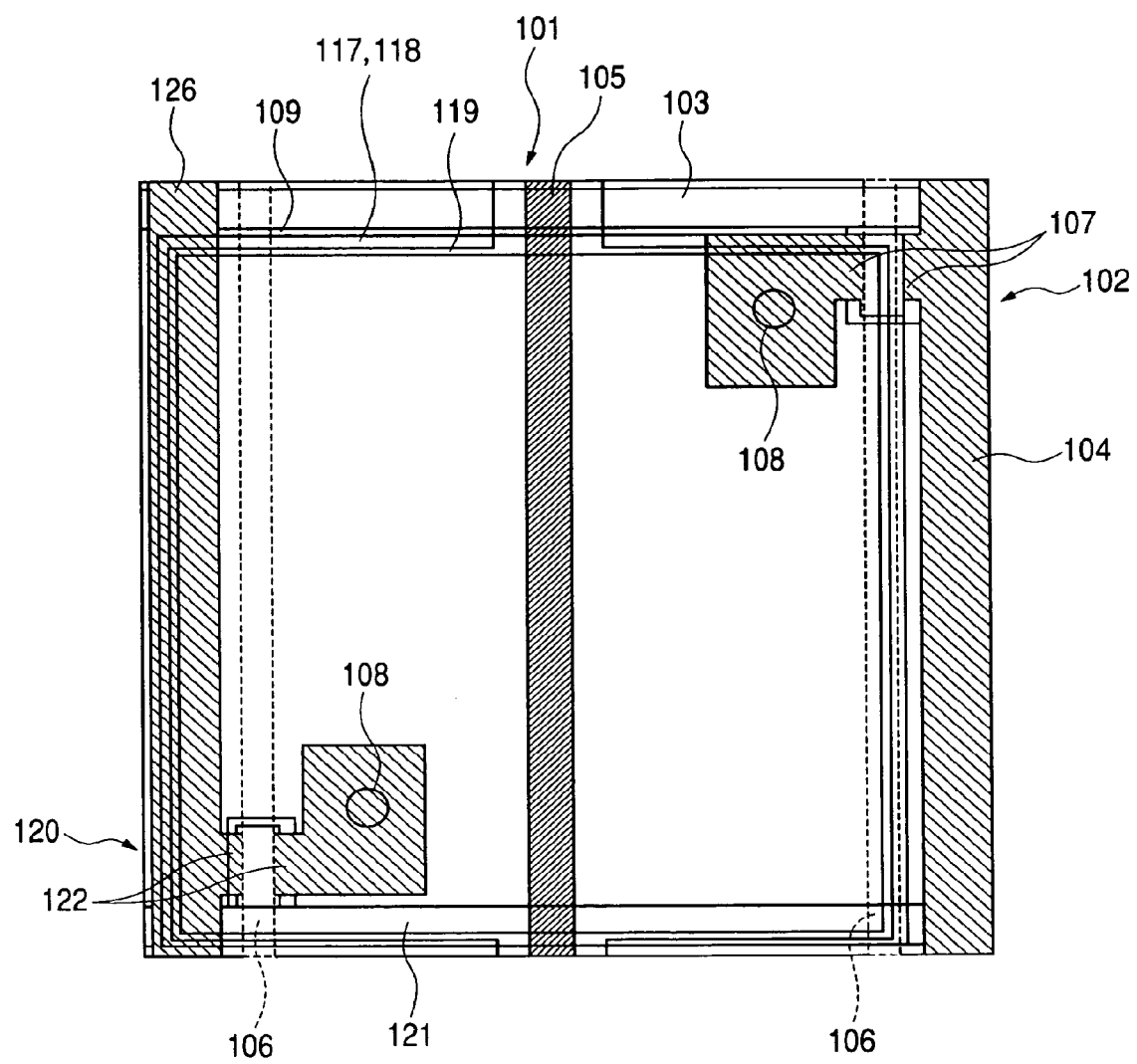
FIG. 6 is a schematic plan view of one pixel of the solid-state image pickup device according to Embodiment 2 of the present invention.
Figure 7:
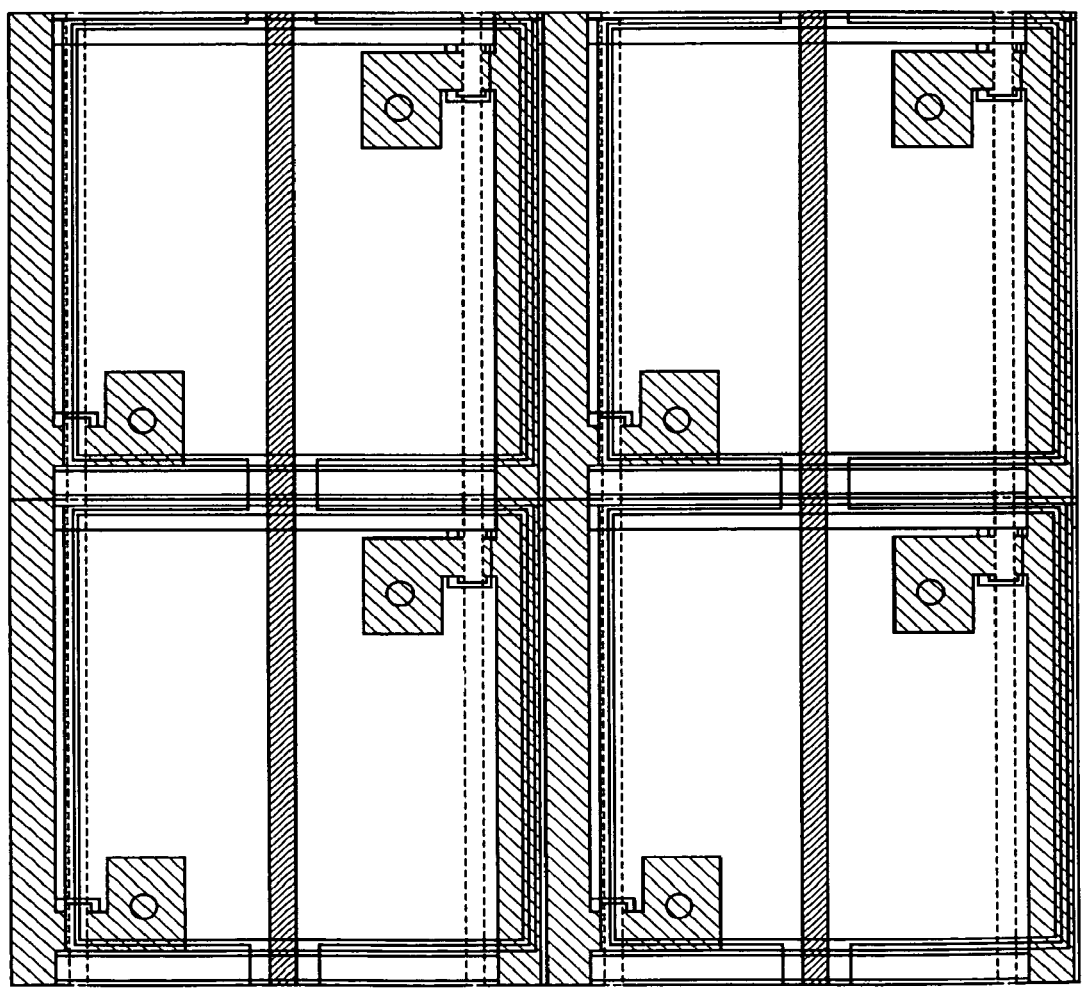
FIG. 7 is a schematic plan view of four pixels of the solid-state image pickup device according to Embodiment 2 of the present invention.
Figure 8:
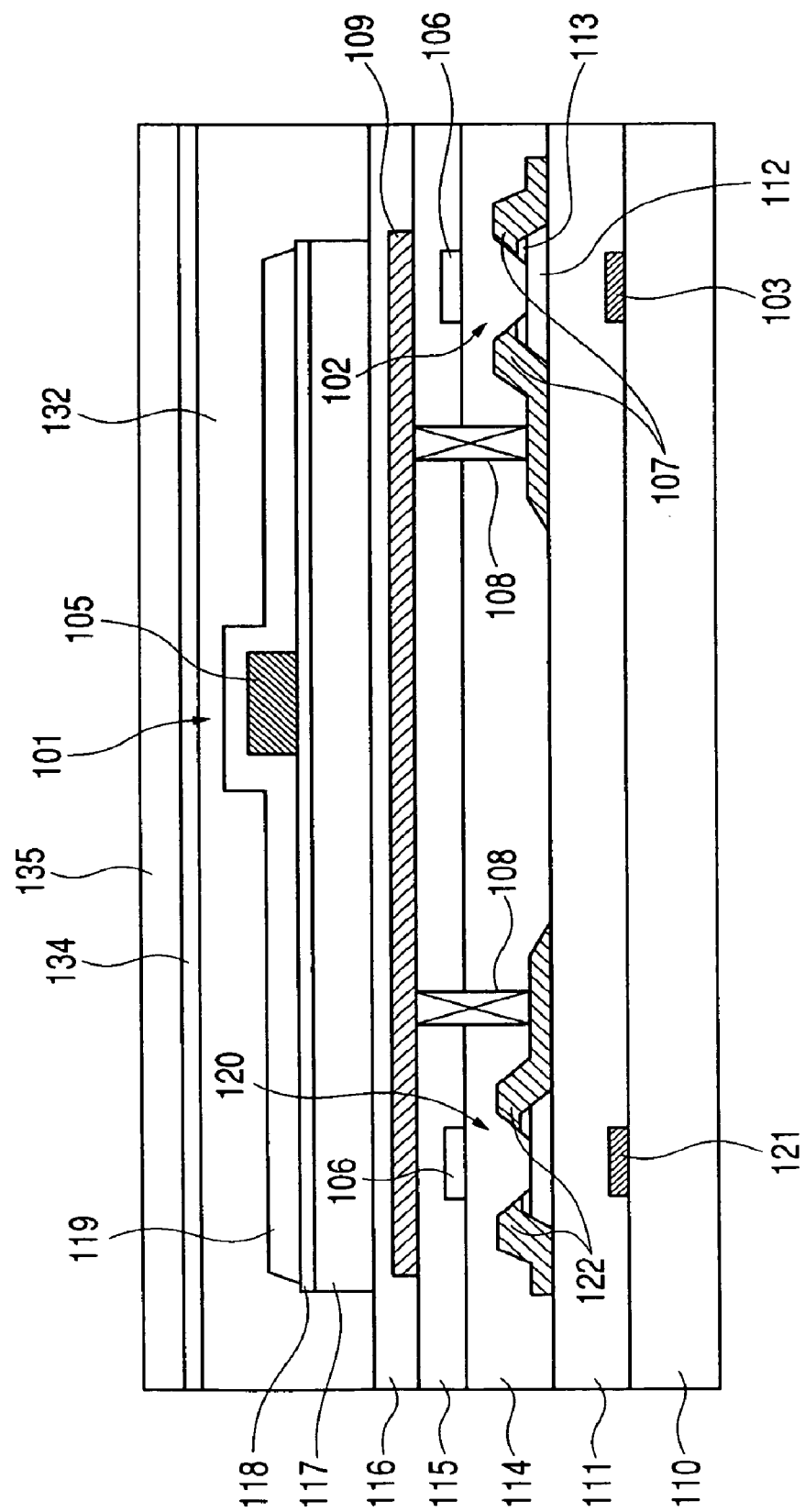
FIG. 8 is a schematic cross-sectional view of the solid-state image pickup device according to Embodiment 2 of the present invention.

FIG. 5 is a schematic equivalent circuit diagram of pixels disposed in matrix of 3×3 of a solid-state image pickup device according to Embodiment 2, FIG. 6 is a schematic plan view of one pixel of the solid-state image pickup device according to this embodiment, FIG. 7 is a schematic plan view of four pixels of the solid-state image pickup device according to this embodiment, and FIG. 8 is a schematic cross-sectional view of the solid-state image pickup device according to this embodiment.

The same reference numerals as those in Embodiment 1 indicate the same components.

In FIGS. 5 and 6, reference numeral 101 designates a MIS type PD; reference numeral 102 designates a transferring TFT; reference numeral 103 designates a transferring TFT driving wiring; reference numeral 104 designates a signal line; reference numeral 105 designates a sensor biasing wiring; reference numeral 106 designates a shielding wiring (GND wiring); reference numeral 108, a contact hole; reference numeral 109, a sensor lower electrode layer; reference numeral 120, a resetting TFT as a switching element; reference numeral 121, a resetting TFT driving wiring; and 126, a reset wiring.

In FIG. 8, reference numeral 110 designates an insulating substrate made of glass or the like; reference numeral 111 designates a gate insulating film made of SiN, $SiO_2$ or the like; reference numeral 112 designates a first amorphous semiconductor layer made of a-Si or the like; reference numeral 113 designates a first n$^+$-type layer (ohmic contact layer); reference numerals 114 and 115 each designate an interlayer insulating film made of SiN, $SiO_2$, benzocyclobutene (BCB), polyimide (PI) or the like; reference numeral 116 designates an insulating film made of SiN, $SiO_2$ or the like; reference numeral 117, a second amorphous semiconductor layer made of a-Si or the like; reference numeral 118, a second n$^+$-type layer (hole blocking layer) made of microcrystalline silicon, a-Si or the like; reference numeral 119, a transparent electrode layer made of ITO, $SnO_2$ or the like; reference numeral 107, a source/drain electrode layer of the transferring TFT 102; reference numeral 122, a source/drain electrode layer of the resetting TFT; reference numeral 132, a passivation layer made of SiN, PI or the like; reference numeral 134, an adhesion layer; and 135, a phosphor layer.

Note that, in FIG. 8, reference numerals 103 and 121 each designate a gate electrode layer, reference numeral 105 designates a sensor biasing electrode layer, and reference numeral 106 designates a shielding electrode layer.

The insulating film 116, the second amorphous semiconductor layer 117 made of a-Si or the like, and the second n$^+$-type layer 118 constitute a photoelectric conversion layer of the MIS-type PD 101. The gate electrode layer 103, the gate insulating film 111 made of SiN, $SiO_2$ or the like, the first amorphous semiconductor layer 112 made of a-Si or the like, the first n$^+$-type layer (ohmic contact layer) 113, and the source/drain electrode layer 107 for the transferring TFT constitute the transferring TFT 102. The gate electrode layer 121, the gate insulating film 111 made of SiN, $SiO_2$ or the like, the first amorphous semiconductor layer 112 made of a-Si or the like, the first n$^+$-type layer (ohmic contact layer) 113, and the source/drain electrode layer 122 of the resetting TFT constitute the resetting TFT 120. The photoelectric conversion layer is formed above the transferring TFT 102 and the resetting TFT 120, and hence both the TFTs are covered with the photoelectric conversion layer.

The shielding electrode layer 106 is disposed so as to be interposed between the MIS type PD 101 and the transferring TFT 102, and between the MIS-type PD 101 and the resetting TFT 120.

Radiation such as X-rays is made incident from above in FIG. 6 to be converted into visible rays of light through the phosphor layer 135. The resultant rays are then converted into electric charges by the MIS-type PD 101 to be accumulated in the MIS-type PD 101. Thereafter, the transferring TFT 102 is operated by the transferring TFT driving wiring 103 connected to a TFT driving circuit to transfer these accumulated electric charges to the signal line 104 connected to one of the source electrode and the drain electrode of the transferring TFT 102 to be processed in the signal processing circuit, and the resultant analog signal is then subjected to A/D conversion in the A/D conversion circuit, to be outputted. Thereafter, the resetting TFT 120 is operated by the resetting TFT driving wiring 121 connected to the signal processing circuit to reset the MIS-type PD 101. In this processing the electric potential of the shielding wiring 106 is fixed to a constant electric potential such as GND at all times.

In this embodiment, the shielding wiring 106 disposed below the sensor element is grounded. As a result, even if the electric potential of a separate electrode of the sensor element fluctuates, fluctuation in characteristics due to generation of a leakage current of the TFT element can be suppressed, to allow enhancement of sensitivity to be attained. In addition, since the shielding wiring 106 does not overlap the signal line 104 at all, no parasitic capacitance is formed between the shielding wiring 106 and the signal line 104, and hence degradation of the sensor sensitivity can also be suppressed.

In this embodiment, there has been shown the specific case where the width of the shielding wiring 106 is identical to the channel length of the TFT. However, in order to reduce the capacitance in a cross portion between the respective TFT driving wirings, it is also possible to use a wiring having a width smaller than the channel length in the cross portion between the respective TFT driving wirings.

Embodiment 3

Description will hereinafter be given with respect to a solid-state image pickup device using a MIS-type PD according to Embodiment 3 of the present invention.

Figure 9:
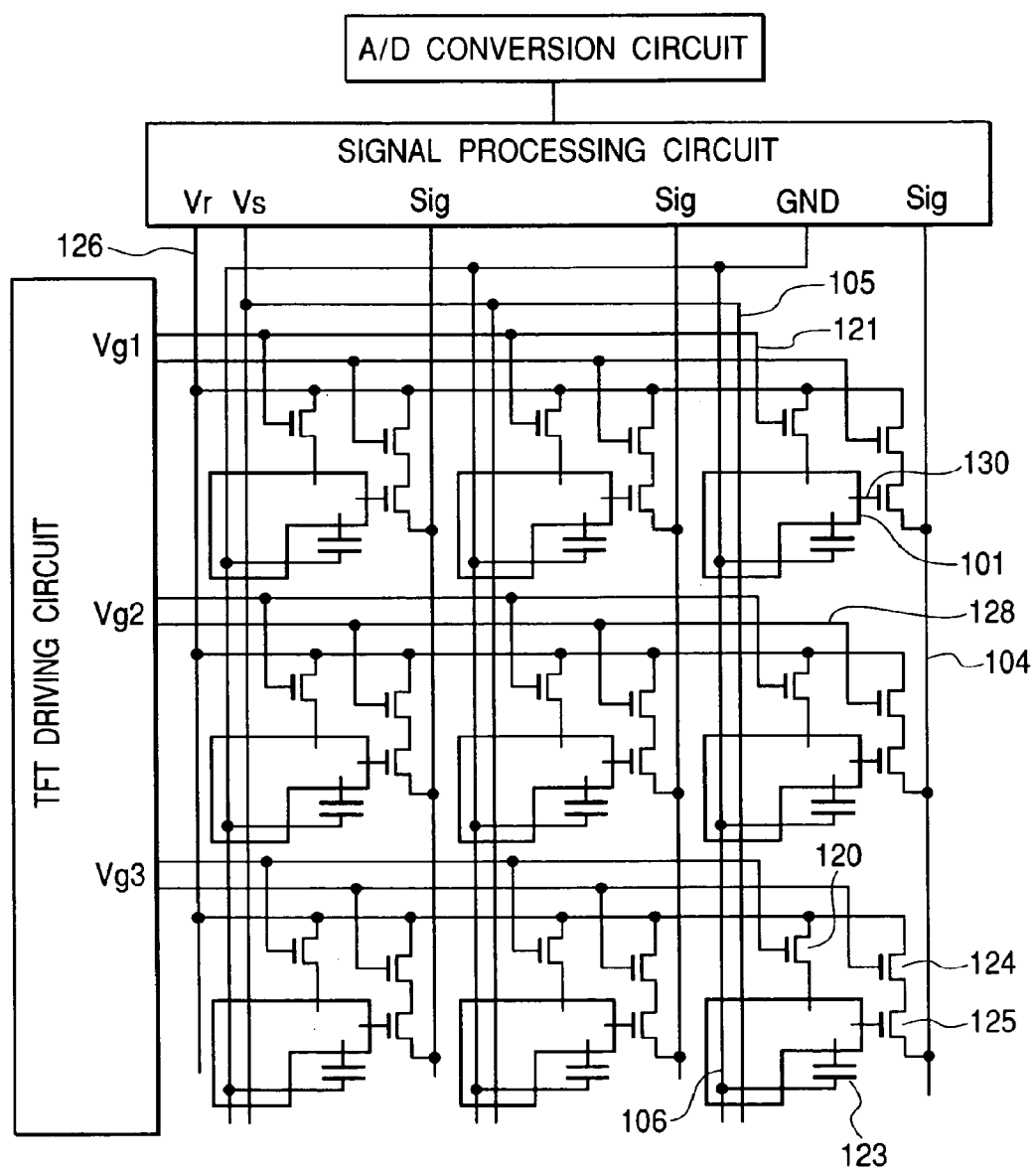
FIG. 9 is a schematic equivalent circuit diagram of pixels disposed in matrix of 3×3 of a solid-state image pickup device according to Embodiment 3 of the present invention.
Figure 10:
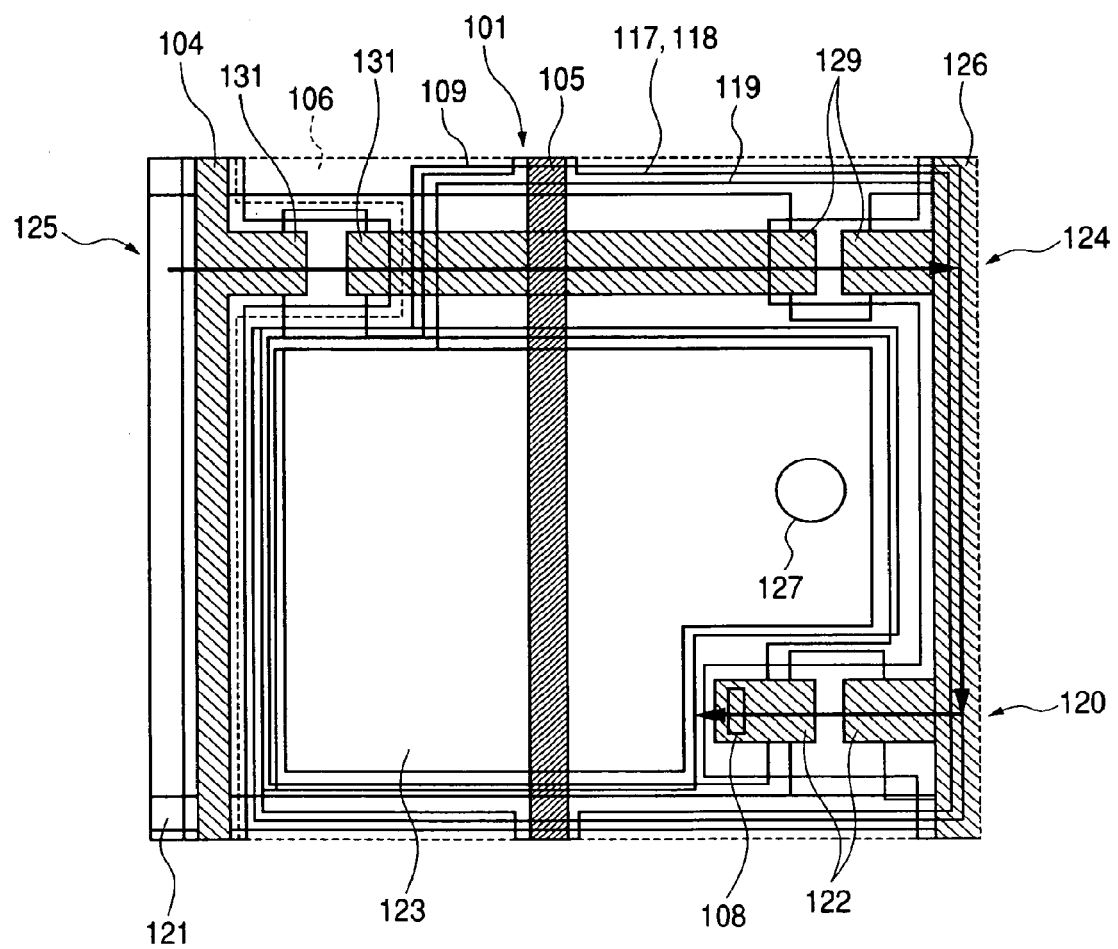
FIG. 10 is a schematic plan view of one pixel of the solid-state image pickup device according to Embodiment 3 of the present invention.
Figure 11:
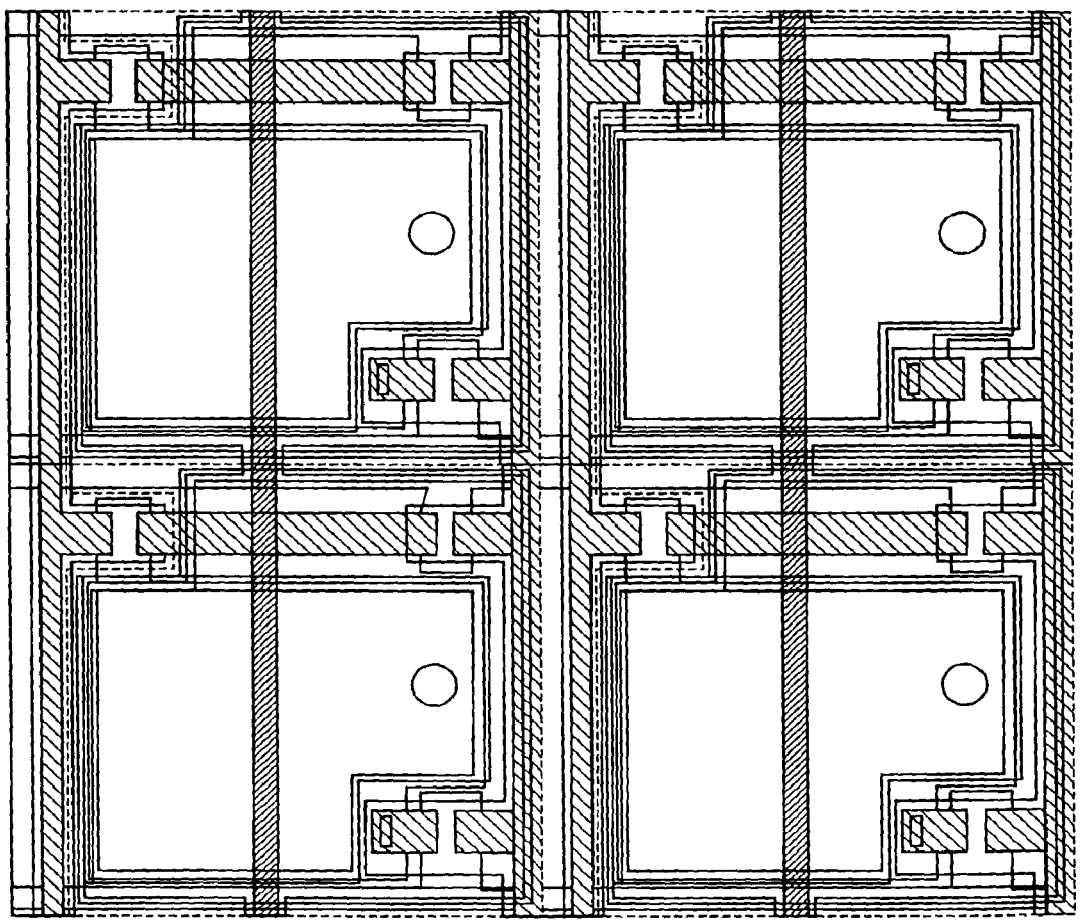
FIG. 11 is a schematic plan view of four pixels of the solid-state image pickup device according to Embodiment 3 of the present invention.
Figure 12:
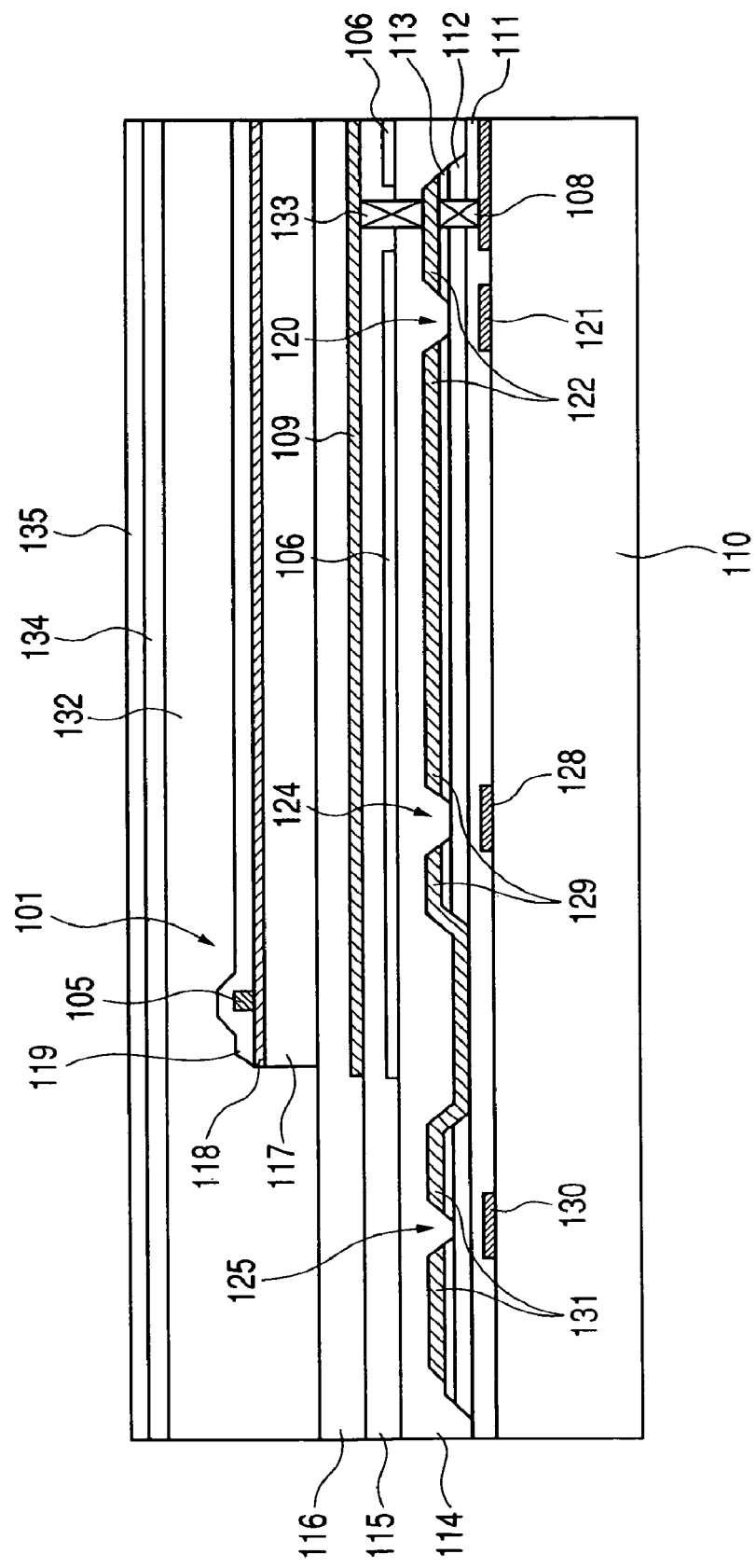
FIG. 12 is a schematic cross-sectional view of the solid-state image pickup device according to Embodiment 3 of the present invention.

FIG. 9 is a schematic equivalent circuit diagram of pixels disposed in matrix of 3×3 of a solid-state image pickup device according to Embodiment 3, FIG. 10 is a schematic plan view of one pixel of the solid-state image pickup device according to this embodiment, FIG. 11 is a schematic plan view of four pixels of the solid-state image pickup device according to this embodiment, and FIG. 12 is a schematic cross-sectional view of the solid-state image pickup device according to this embodiment.

The same reference numerals as those in Embodiment 1 indicate the same components.

In FIGS. 9 and 10, reference numeral 101 designates a MIS-type PD; reference numeral 104 designates a signal line; reference numeral 105 designates a sensor biasing wiring; reference numeral 106 designates a shielding wiring (GND wiring); reference numeral 108 designates a contact hole; reference numeral 109 designates a sensor lower electrode; reference numeral 120 designates a resetting TFT; reference numeral 121 designates a resetting TFT driving wiring; reference numeral 123, a storage capacitor; reference numerals 124 and 125 designate a switching TFT and a reading TFT forming a source follower ("SFA"), respectively; reference numeral 126, a reset wiring; reference numeral 127, a contact hole through which the storage capacitor 123 and the shielding wiring 106 are connected to each other; reference numeral 128, a switching TFT driving wiring; and 130, a reading TFT driving electrode.

FIG. 12 is a schematic cross-sectional view showing a part of the solid-state image pickup device indicated by an arrow in FIG. 10. Reference numeral 110 designates an insulating substrate made of glass or the like; reference numeral 111 designates a gate insulating film made of SiN, SiO$_2$ or the like; reference numeral 112 designates a first amorphous semiconductor layer made of a-Si or the like; reference numeral 113 designates a first n$^+$-type layer (ohmic contact layer); reference numerals 114 and 115 each designate an interlayer insulating film made of SiN, SiO$_2$, benzocyclobutene (BCB), polyimide (PI) or the like; reference numeral 116 designates an insulating film made of SiN, SiO$_2$ or the like; reference numeral 117, a second amorphous semiconductor layer made of a-Si or the like; reference numeral 118, a second n$^+$-type layer (hole blocking layer) made of microcrystalline silicon, a-Si or the like; reference numeral 119, a transparent electrode layer made of ITO, SnO$_2$ or the like; reference numeral 122, a source/drain electrode layer of the resetting TFT; reference numeral 129, a source/drain electrode layer of the switching TFT; reference numeral 131, a source/drain electrode layer of the reading TFT; reference numeral 132, a passivation layer made of SiN, PI or the like; reference numeral 133, a contact hole; reference numeral 134, an adhesion layer; and 135, a phosphor layer.

Note that, in FIG. 12, reference numerals 121, 128, and 130 each designate a gate electrode layer, reference numeral 105 designates a sensor biasing electrode layer, and reference numeral 106 designates a shielding electrode layer.

The insulating film 116, the second amorphous semiconductor layer 117, and the second n$^+$-type layer 118 constitute a photoelectric conversion layer of the MIS type PD 101. The gate electrode layer 121, the gate insulating film 111 made of SiN, SiO$_2$ or the like, the first amorphous semiconductor layer 112 made of a-Si or the like, the first n$^+$-type layer (ohmic contact layer) 113, and the source/drain electrode layer 122 for the resetting TFT constitute the resetting TFT 120. The gate electrode layer 128, the gate insulating film 111 made of SiN, SiO$_2$ or the like, the first amorphous semiconductor layer 112 made of a-Si or the like, the first n$^+$-type layer (ohmic contact layer) 113, and the source/drain electrode layer 129 of the switching TFT constitute the switching TFT 124. The photoelectric conversion layer is formed above the resetting TFT 120 and the switching TFT 124, and hence both the TFTs are covered with the photoelectric conversion layer.

The shielding electrode layer 106 is disposed so as to be interposed between the MIS-type PD 101 and the resetting TFT 120, and between the MIS type PD 101 and the switching TFT 124.

Radiation such as X-rays is made incident from above in FIG. 10 to be converted into visible rays of light through the phosphor layer 135. The resultant rays are then converted into electric charges by the MIS type PD 101 to be accumulated in the storage capacitor 123 through the contact holes 108 and 133. Fluctuation in electric potential corresponding to these accumulated electric charges is caused in the gate electrode of the reading TFT 125. Thereafter, the switching TFT 124 is operated through the switching TFT driving wiring 128 so that the accumulated electric charges are read out through the signal line 104 connected to one of the source electrode and the drain electrode of the reading TFT 125 to be processed in the signal processing circuit. The resultant analog signal is then subjected to A/D conversion in an A/D conversion circuit, to be outputted. Thereafter, the resetting TFT 120 is operated through the resetting TFT driving wiring 121 connected to the signal processing circuit to reset the storage capacitor 123. In this processing the electric potential of the shielding wiring 106 is fixed to a constant electric potential such as GND at all times.

In this embodiment, the shielding wiring 106 disposed below the sensor element is grounded. As a result, even if the electric potential of a separate electrode of the sensor element fluctuates, fluctuation in characteristics due to generation of a leakage current of the TFT element can be suppressed, to allow enhancement of sensitivity to be attained. In addition, since the shielding wiring 106 does not overlap the signal line 104 at all, no parasitic capacitance is formed between the shielding wiring 106 and the signal line 104, and hence degradation of the sensor sensitivity can also be suppressed.

In this embodiment, there has been shown the specific case where the shielding wiring portion is disposed above the two TFT portions and the storage capacitor portion. However, it is also possible to dispose the shielding wiring portion above three TFT portions and the storage capacitor portion.

In each of Embodiments 1 to 3 of the present invention described above, there has been shown specific cases where, in the indirect type solid-state image pickup device, the MIS-type PD is used as the photoelectric conversion element. However, it is also possible to use a PIN-type PD. In case of the PIN-type PD, the photoelectric conversion layer includes a p$^+$-type layer, a second amorphous semiconductor layer, and a second n$^+$-type layer instead of the insulating film 116, the second amorphous semiconductor layer 117, and the second n$^+$-type layer 118, respectively.

Embodiment 4

Description will hereinafter be given with respect to a direct type radiation image pickup device according to Embodiment 4 of the present invention.

Figure 13:
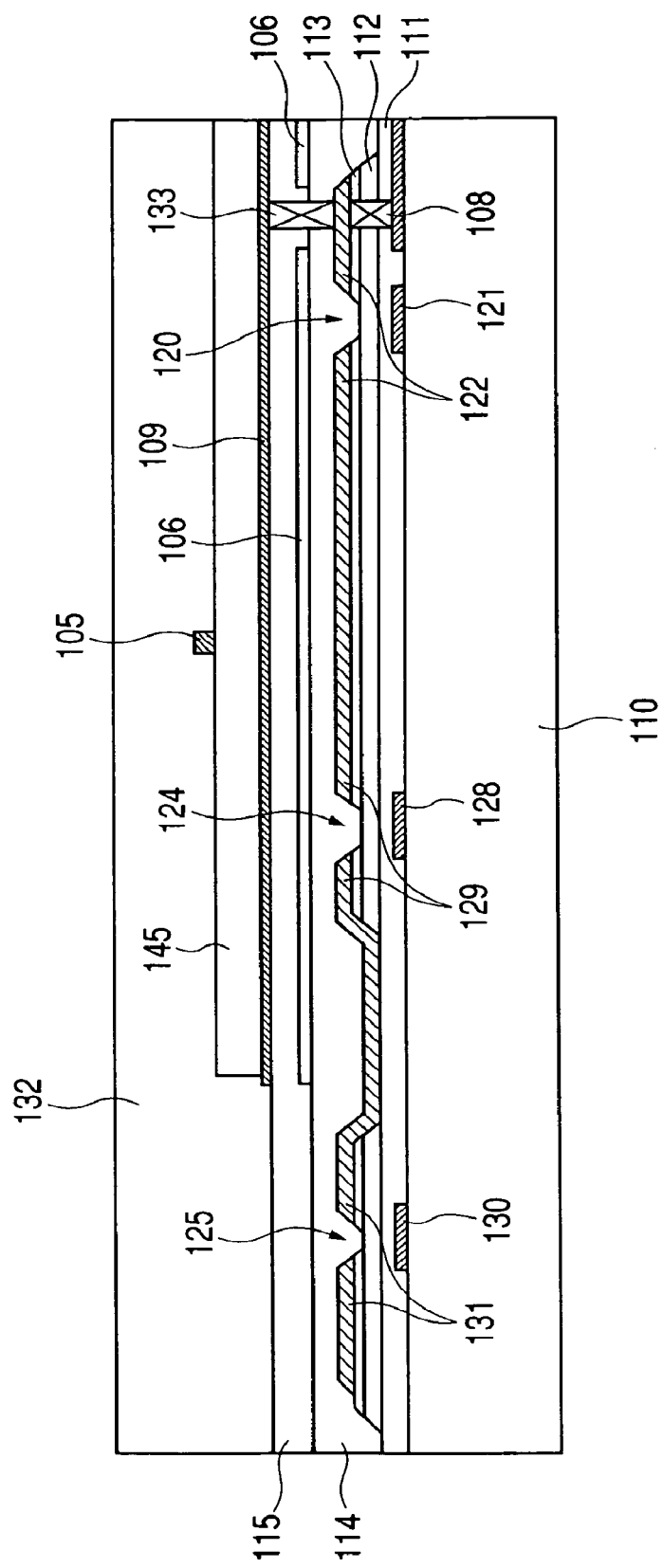
FIG. 13 is a schematic cross-sectional view of a radiation image pickup device according to Embodiment 4 of the present invention.

FIG. 13 is a schematic cross-sectional view of a direct type radiation image pickup device. Reference numeral 110 designates an insulating substrate made of glass or the like; reference numeral 111 designates a gate insulating film made of SiN, $SiO_2$ or the like; reference numeral 112 designates a first amorphous semiconductor layer made of a-Si or the like; reference numeral 113 designates an $n^+$-type layer (ohmic contact layer); reference numerals 114 and 115 each designate an interlayer insulating film made of SiN, $SiO_2$, benzocyclobutene (BCB), polyimide (PI) or the like; reference numeral 120 designates a resetting TFT; reference numeral 123 designates a storage capacitor; reference numerals 124 and 125 designate a switching TFT and a reading TFT forming a source follower (SFA), respectively; reference numeral 121 designates a resetting TFT driving wiring; reference numeral 122, a source/drain electrode layer of the resetting TFT; reference numeral 129, a source/drain electrode layer of the switching TFT; reference numeral 128, a switching TFT driving wiring; reference numeral 130, a reading TFT driving electrode; reference numeral 131, a source/drain electrode layer of the reading TFT; reference numeral 132, a passivation layer made of SiN, PI or the like; reference numeral 133, a contact hole; and reference numeral 145, a radiation conversion layer for directly converting radiation into electric charges.

A circuit diagram of the radiation image pickup device shown in FIG. 13 is the same as that of FIG. 1 except that the radiation conversion layer 145 is used instead of the MIS-type photodiode 101. In the direct type radiation image pickup device, a-Se, GaAs, CdTe or the like is used as a material of the radiation conversion layer.

Note that, in FIG. 13, reference numerals 121, 128 and 130 each designate a gate electrode layer, reference numeral 105 designates a sensor biasing electrode layer, and reference numeral 106 designates a shielding electrode layer.

A layer structure of the resetting TFT 120 and the reading TFT 124 is the same as that in Embodiment 3. The radiation conversion layer 145 is formed above the resetting TFT 120 and the reading TFT 124, and hence both the TFTs 120 and 124 are covered with the radiation conversion layer 145.

Further, the shielding electrode layer 106 is disposed so as to be interposed between the radiation conversion layer 145 and the resetting TFT 120, and between the radiation conversion layer 145 and the switching TFT 124.

Radiation such as X-rays is made incident from an upper side of the radiation conversion layer shown in FIG. 13, to be directly converted into electric charges through the radiation conversion layer 145. The resultant electric charges are then accumulated in the storage capacitor 123 through the contact holes 108 and 133. Fluctuation in electric potential corresponding to the accumulated electric charges is caused in the gate electrode of the reading TFT 125. Thereafter, the switching TFT 124 is operated through the switching driving wiring 128 so that the accumulated electric charges are read out through the signal line 104 connected to one of the source electrode and the drain electrode of the reading TFT 125 to be processed in a signal processing circuit. The resultant analog signal is then subjected to A/D conversion in an A/D conversion circuit, to be outputted. Thereafter, the resetting TFT 120 is operated through the resetting TFT driving wiring 121 connected to the signal processing circuit to reset the storage capacitor 123. In this processing the electric potential of the shielding wiring 106 is fixed to a constant electric potential such as GND at all times.

While above, the embodiments of the present invention have been described, additional preferred embodiment modes of the present invention will now be enumerated as follows.

Embodiment Mode 1

A solid-state image pickup device including a plurality of photoelectric conversion elements and a plurality of switching elements, in which the photoelectric conversion element is formed above at least one switching element, and a shielding electrode layer is disposed between the switching elements and the photoelectric conversion elements.

Embodiment Mode 2

A solid-state image pickup device according to Embodiment Mode 1, in which one photoelectric conversion element and one or more switching elements are disposed in one pixel.

Embodiment Mode 3

A solid-state image pickup device according to Embodiment Mode 1 or 2, in which the photoelectric conversion element has a photoelectric conversion layer, and the photoelectric conversion layer includes an insulating layer, a semiconductor layer, and a high impurity concentrated semiconductor layer.

Embodiment Mode 4

A solid-state image pickup device according to Embodiment Mode 1 or 2, in which the photoelectric conversion element has a photoelectric conversion layer, and the photoelectric conversion layer includes a first high impurity concentrated semiconductor layer of one conductivity type, a semiconductor layer, and a second high impurity concentrated semiconductor layer of a conductivity type opposite to the one conductivity type of the first high impurity concentrated semiconductor layer.

Embodiment Mode 5

A solid-state image pickup device according to any one of Embodiment Modes 1 to 4, in which the shielding electrode layer is not formed above a signal line connected to one of a source electrode and a drain electrode of the switching element.

Embodiment Mode 6

A solid-state image pickup device according to any one of Embodiment Modes 1 to 5, in which the shielding electrode layer is held at a constant electric potential.

Embodiment Mode 7 solid-state image pickup device according to Embodiment Mode 6, in which the shielding electrode layer is grounded.

Embodiment Mode 8

A solid-state image pickup device according to any one of Embodiment Modes 1 to 7, in which each of the switching elements is constituted by a TFT, and the shielding electrode layer is disposed so as to cover an upper portion of a channel of each of the TFTs.

Embodiment Mode 9

A solid-state image pickup device according to Embodiment Mode 8, in which the shielding electrode layer has a width equal to or smaller than the channel length of the TFT and is disposed so as to cross a TFT driving wiring.

Embodiment Mode 10

A solid-state image pickup device according to any one of Embodiment Modes 1 to 9, in which the shielding electrode layer is made of a high melting point metal.

Embodiment Mode 11

A solid-state image pickup device according to Embodiment Mode 10, in which the shielding electrode layer is made of molybdenum (Mo), chromium (Cr), titanium (Ti), tungsten (W), or molybdenum-tungsten (MoW).

Embodiment Mode 12

A solid-state image pickup device according to Embodiment Mode 1, in which the shielding electrode layer is an electrode layer thinner than each of a gate electrode layer, a source/drain electrode layer, and a sensor biasing electrode layer.

Embodiment Mode 13

A solid-state image pickup device according to Embodiment Mode 1, in which the solid-state image pickup device includes a gate electrode layer, a gate insulating layer, a first amorphous semiconductor layer, a first n-type semiconductor layer, a source/drain electrode layer, a first interlayer insulating layer, the shielding electrode layer, a second interlayer insulating layer, a sensor lower electrode layer, an insulating layer, a second amorphous semiconductor layer, a second n-type semiconductor layer, a transparent electrode layer, and a sensor biasing electrode layer.

Embodiment Mode 14

A solid-state image pickup device according to Embodiment Mode 13, in which one photoelectric conversion element and one or more TFTs are disposed in one pixel.

Embodiment Mode 15

A radiation image pickup device, in which a wavelength conversion unit is disposed above the photoelectric conversion element in the solid-state image pickup device as described in any one of Embodiment Modes 1 to 9.

Embodiment Mode 16

A radiation image pickup device according to Embodiment Mode 15, in which one photoelectric conversion element and one or more switching elements are disposed in one pixel.

Embodiment Mode 17

A radiation image pickup device including a radiation conversion layer for directly converting radiation into electric charges, and a plurality of switching elements, in which the radiation conversion layer is formed above one or more switching elements, and a shielding electrode layer is disposed between the switching elements and the radiation conversion layer.

Embodiment Mode 18

A radiation image pickup device according to Embodiment Mode 17, in which the radiation image pickup device includes a gate electrode layer, a gate insulating layer, a first amorphous semiconductor layer, a first n-type semiconductor layer, a source/drain electrode layer, a first interlayer insulating layer, the shielding electrode layer, a second interlayer insulating layer, a sensor lower electrode layer, a radiation conversion layer, and a sensor biasing electrode layer.

As set forth hereinabove, according to the present invention, even if fluctuation in electric potential of the separate electrode of the sensor element is caused, the fluctuation in characteristics due to generation of a leakage current of the switching element can be suppressed by provision of the shielding wiring disposed below the sensor element, to allow enhancement of sensitivity to be attained. Moreover, since the shielding wiring does not overlap the signal line at all, a parasitic capacitance formed between the shielding wiring and the signal line can be reduced to allow the degradation as well of the sensor sensitivity to be suppressed.

In addition, the shielding wiring having a width smaller than the channel length is used in the cross portion between the shielding wiring and the driving wiring of the switching element to allow the gate wiring capacitance also to be reduced.

As many apparently widely different embodiments of the present invention can be made without departing from the spirit and scope thereof, it is to be understood that the invention is not limited to the specific embodiments thereof except as defined in the claims.

What is claimed is:

1. A solid-state image pickup device comprising a plurality of photoelectric conversion elements and a plurality of thin film transistors each of which comprises a source electrode and a drain electrode, and a signal line connected to one of the source electrode and the drain electrode of the thin film transistor, wherein each photoelectric conversion element is formed above at least one of the thin film transistors, and a shielding electrode layer is disposed between that thin film transistor and that photoelectric conversion element, and disposed on a region except for a region above the signal line and a region above the one of the source electrode and the drain electrode connected to the signal line.

2. A solid-state image pickup device according to claim 1, wherein one photoelectric conversion element and one or more switching elements are disposed in one pixel.

3. A solid-state image pickup device according to claim 1, wherein each photoelectric conversion element has a photoelectric conversion layer, and the photoelectric conversion layer includes an insulating layer, a semiconductor layer, and a high impurity concentrated semiconductor layer.

4. A solid-state image pickup device according to claim 1, wherein each photoelectric conversion element has a photoelectric conversion layer, and the photoelectric conversion layer includes a first high impurity concentrated semiconductor layer of one conductivity type, a semiconductor layer, and a second high impurity concentrated semiconductor layer of a conductivity type opposite to the one conductivity type of the first high impurity concentrated semiconductor layer.

5. A solid-state image pickup device according to claim 1, wherein the shielding electrode layer is held at a constant electric potential.

6. A solid-state image pickup device according to claim 5, wherein the shielding electrode layer is grounded.

7. A solid-state image pickup device according to claim 1, wherein the shielding electrode layer is disposed so as to cover an upper portion of a channel of each of the thin film transistors, and so as not to cover an upper portion of whichever of the source electrode and the drain electrodes is not connected to the signal line.

8. A solid-state image pickup device according to claim 7, wherein the shielding electrode layer crosses a thin film transistor driving wiring, and has at the crossing point a width equal to or smaller than a channel length of the thin film transistor.

9. A solid-state image pickup device according to claim 1, wherein the shielding electrode layer is made of a high melting point metal.

10. A solid-state image pickup device according to claim 9, wherein the shielding electrode layer is made of molybdenum (Mo), chromium (Cr), titanium (Ti) tungsten (W), or molybdenum-tungsten (MoW).

11. A solid-state image pickup device according to claim 1, wherein a film thickness of the shielding electrode layer is thinner than each of a film thickness of a gate electrode layer, a source/drain electrode layer, and a sensor biasing electrode layer.

12. A solid-state image pickup device according to claim 1, wherein the solid-state image pickup device includes a gate electrode layer, a gate insulating layer, a first amorphous semiconductor layer, a first n-type semiconductor layer, a source/drain electrode layer, a first interlayer insulating layer, the shielding electrode layer, a second interlayer insulating layer, a sensor lower electrode layer, an insulating layer, a second amorphous semiconductor layer, a second n-type semiconductor layer, a transparent electrode layer, and a sensor biasing electrode layer.

13. A solid-state image pickup device according to claim 12, wherein one photoelectric conversion element and one or more TFTs are disposed in one pixel.

14. A solid-state image pickup device according to claim 1, wherein the shielding electrode layer is disposed so as to cover an upper portion of a channel of each of the thin film transistors, and has a width equal to or smaller than a channel length of the thin film transistor and is disposed so as to cross a thin film transistor driving wiring.

15. A radiation image pickup device, wherein a wavelength conversion unit is disposed above the photoelectric conversion element in the solid-state image pickup device according to claim 1.

16. A radiation image pickup device according to claim 15, wherein one photoelectric conversion element and one or more switching elements are disposed in one pixel.

17. A radiation image pickup device comprising a radiation conversion layer for directly converting radiation into electric charges, and a plurality of thin film transistors each of which comprises a source electrode and a drain electrode, and a signal line connected to one of the source electrode and the drain electrode of the thin film transistor, wherein the radiation conversion layer is formed above one or more of the thin film transistors, and a shielding electrode layer is disposed between the one or more thin film transistors and the radiation conversion layer, and disposed on a region except for a region above the signal line and a region above the one of the source electrode and the drain electrode connected to the signal line.

18. A radiation image pickup device according to claim 17, wherein the radiation image pickup device includes a gate electrode layer, a gate insulating layer, a first amorphous semiconductor layer, a first n-type semiconductor layer, a source/drain electrode layer, a first interlayer insulating layer, the shielding electrode layer, a second interlayer insulating layer, a sensor lower electrode layer, a radiation conversion layer, and a sensor biasing electrode layer.

* * * * *